July 17, 1951 J. KURSHAN 2,561,123

MULTICONTACT SEMICONDUCTOR DEVICES

Filed April 4, 1950

INVENTOR
Jerome Kurshan
BY H. C. Newton
ATTORNEY

Patented July 17, 1951 2,561,123

UNITED STATES PATENT OFFICE 2,561,123

MULTICONTACT SEMICONDUCTOR DEVICES

Jerome Kurshan, Princeton, N. J., assignor to Radio Corporation of America, a corporation of Delaware Application April 4, 1950, Serial No. 153,798

8 Claims. (Cl. 175—366)

This invention relates to semi-conductor devices and more particularly to a multi-contact device of the semi-conductor type which will provide an amplifier, oscillator or the like.

A semi-conductor device which will provide an amplifier, oscillator or the like may comprise a semi-conducting crystal such as a germanium crystal and a plurality of electrodes in contact with the crystal. One of the electrodes is normally a large-area electrode in low-resistance, non-rectifying contact with the crystal. This electrode is usually called the base electrode. The other two electrodes of such a device are in high-resistance, rectifying contact with the crystal. These electrodes are called the emitter and collector electrodes and are usually point electrodes. A bias voltage is applied between collector and base electrodes in a relatively non-conducting or reverse polarity. The bias potential applied between emitter and base electrodes is in the forward or relatively conducting polarity. Thus, if the semi-conducting crystal is of the N type, the collector is biased negatively with respect to the base while the emitter is biased positively with respect to the base. If a P type crystal is used, the polarities of the bias voltages have to be reversed.

The emitter and collector electrodes usually consist of pointed wires disposed closely adjacent to each other on a surface of the crystal. When the electrodes are arranged in such a manner the electric field configuration does not permit the collection of all the charge carriers emitted by the emitter. Furthermore, the distance between the point electrodes, that is, between emitter and collector usually must be critically adjusted by hand. For some purposes such as for a modulator two emitter electrodes may be required so that altogether three point electrodes must be disposed on a surface of the crystal. This makes it still more difficult to provide for the correct spacing between the various point electrodes.

It is accordingly an object of the present invention to provide a semi-conductor device suitable as an amplifier or oscillator having at least one emitter electrode and one collector electrode, each consisting of a plurality of individual small-area contacts on the semi-conducting crystal, thereby to improve the configuration of the electric field between the electrodes for maximum interaction therebetween.

A further object of the invention is to provide a device of the character described including a semi-conducting crystal and a plurality of conductors in point or in line contact with the crystal which will permit more uniform contact between the conductors and the crystal and which will make it possible to interconnect a plurality of conductors to provide a single electrode.

Another object of the invention is to provide a multi-contact semi-conductor device which is readily adapted for quantity production and which eliminates the necessity of critical manual adjustment of the distances or spacings between the small-area electrodes of the device.

In accordance with the present invention a screen mesh consisting of two sets of fine wires disposed at right angles to each other is utilized to provide two or more point electrodes for a semi-conductor device. The individual wires of the screen are provided with a layer of insulating material before weaving. This layer is removed from one surface of the screen which is then pressed and held against a surface of a semi-conducting crystal in electrical contact therewith. Selected ones of the wires of each set may be interconnected to provide one electrode. Thus, either all the wires of one set may be interconnected or alternate ones of the wires may be connected together. In this manner, two or more rectifying electrodes may be provided which are in contact with the crystal. The correct spacing between adjacent contacts is automatically obtained by the spacing of the wires in the screen. This greatly facilitates the manufacture of the semi-conductor device. Another surface of the semi-conducting crystal may then be provided with a base electrode as is conventional.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4:
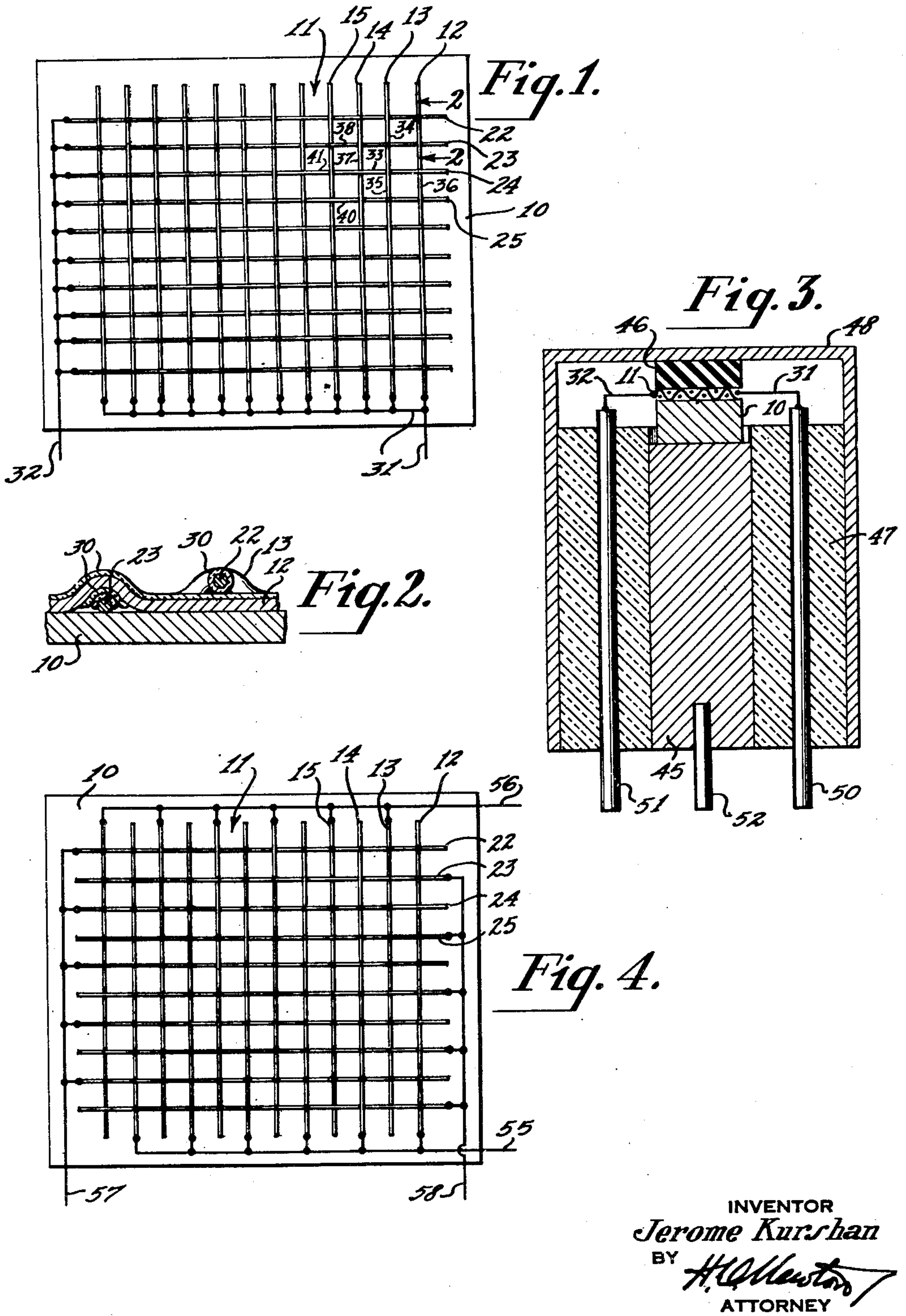
Figure 1 is a top plan view of a semi-conductor device embodying the present invention.
Figure 2 is a cross-sectional view on enlarged scale of the device of Figure 1 taken on line 2—2 of Figure 1.
Figure 3 is a sectional view of a semi-conductor device suitable as an amplifier or oscillator in accordance with the invention.
Figure 4 is a top plan view of a modification of the device of Figure 1 in accordance with the invention.

Referring now to the drawing in which like components have been designated by the same reference numerals and particularly to Figure 1, there is illustrated a semi-conductor device including a body 10 of semi-conducting material. Body 10 may have the shape of a block or cube and may consist, for example, of germanium. The top surface of body 10 may be treated by polishing and etching it, as is conventional for the manufacture of semi-conductor amplifiers.

In accordance with the present invention, a mesh screen 11 is in contact with body or crystal 10. Mesh screen 11 consists of a first set of fine wires 12, 13, 14, 15, etc. A second set of wires is disposed at right angles to the first set and includes wires 22, 23, 24, 25, etc. The wires of mesh screen 11 may have a thickness of between 1 and 10 mils or more. The wires may consist of any suitable conductor of electricity adapted as contacts for semi-conductor devices such, for example, as tungsten or Phosphor bronze.

As clearly shown in Figure 2, each wire such as 12, 22, and 23 is covered with a layer of insulating material indicated at 30 before the wires are woven. Insulating layers 30 may, for example, consist of enamel, Lucite, Formex or other suitable materials. As clearly shown in Figure 2, insulating layers 30 are removed from one surface of mesh screen 11. This may, for example, be effected by mechanical abrasion. Thus, Figure 2 clearly shows that wire 12 as well as wire 23 has a conducting surface which is in contact with crystal 10.

The wires of screen 11 alternately pass above and below each other. Thus, vertical wire 12, for example, first passes below horizontal wire 22 and then over the next horizontal wire 23. Similarly, horizontal wire 23 first passes below vertical wire 12 and then above the next wire 13 and so on. As shown in Figure 1 all vertical wires 12, 13, 14, 15, etc. may be interconnected by lead or conductor 31. Similarly, all horizontal wires 22, 23, 24, 25, etc., may be interconnected by lead or conductor 32. It may be assumed that the vertical wires connected to lead 31 form the emitter electrode while the horizontal wires connected to lead 32 may form the collector electrode of a semi-conductor device.

The portion 33 of horizontal wire 24 is in continuous contact with body 10 and is disposed between wires 12 and 14. Wire portion 33 forms a single collector contact which is surrounded by wire portions 34, 35 of wire 13 and wire portions 36 and 37 of wires 12 and 14, respectively, which are all emitter contacts. Each of these wire portions 33 to 37 forms an individual line contact with crystal 10 which has a small contact area. It will thus be seen that a collector contact such as 33 is surrounded by four individual emitter contacts such as 34, 35, 36 and 27. Similarly, each emitter contact in turn is surrounded by four collector contacts. Thus, wire contact 37 which is an emitter contact, is surrounded by wire contacts 38 and 40 of wires 23 and 25, respectively, and by wire contacts 33 and 41 of wire 24. The collector electrode connected to lead 32 may be heated by passing electric pulses therethrough, as is conventional.

In order to provide intimate contact between mesh screen 11 and crystal 10 the mesh screen is preferably pressed against the crystal. To this end the device of Figure 3 may be utilized. Mesh screen 11 has been shown schematically and rests on the top surface of crystal 10. Crystal 10 may be soldered to bar 45 which may consist of brass and may have a circular cross-section. Bar 45 accordingly provides a base electrode for crystal 10.

Mesh screen 11 is pressed against crystal 10 by a pad 46 of resilient material such as rubber. Bar 45 has a press fit with cylinder 47 of insulating material which may be provided with an outer cover or housing 48. Housing 48 preferably has a tight fit with insulating cylinder 48. Accordingly, bar 45 may be pushed upwards to press rubber pad 46 against mesh screen 11 and crystal 10 to provide for an intimate contact between the various contacts such as wire portions 33, 34, 35, 36, 37, 38, 40 and 41. Leads 31 and 32 which are connected to the vertical and horizontal wires, respectively, may be connected to rods 50 and 51 which extend through cylinder 47. Rods 50 and 51 thus permit electrical contact with the emitter and collector electrodes. A similar rod 52 may be provided in a suitable opening of bar 45.

The device of Figure 3 may be used as an amplifier, oscillator or the like. It is also feasible to treat, for example, collector electrode 32 electrically as is conventional for semi-conductor devices.

It is to be understood that a device comprising three, four or more point electrodes may easily be provided in accordance with the invention. Figure 4 illustrates such a device having four point electrodes. The device again includes semi-conducting crystal 10 provided with mesh screen 11. In this case, however, alternate vertical wires such as wires 12 and 14 are connected together by lead 55 while the remaining vertical wires such as wires 13, 15 are interconnected by lead 56. Similarly, alternate horizontal wires such as 22, 24 may be interconnected through lead 57 while the remaining alternate horizontal wires such as 23 and 25 are connected together by lead 58. The device of Figure 4 permits to provide, for example, two emitter and two collector electrodes or any other combination of small-area or rectifying electrodes.

The spacing between adjacent line contacts such as shown, for example, at 33 and 38 in Figure 1 is determined by the diameter of the wires and by the distance between adjacent wires. However, it is not necessary that a large open area be provided in the mesh screen 11. In a mesh screen with a minimum open area the distance between adjacent line contacts is of the order of twice the average diameter of the wires. Furthermore, the horizontal and vertical wires of screen 11 need not be of equal diameter. It may also be pointed out that considerably less difficulties will be encountered in manufacturing a wire mesh screen such as 11 with a minimum open area between the meshes.

There has thus been disclosed a novel multi-contact semi-conductor device. The individual contacts of the device may be interconnected in any desired manner to provide two or more electrodes in rectifying contact with a crystal. The contact between the electrodes and the crystal may be made uniform and the configuration of the electric field is such as to provide for maximum interaction between emitter and collector electrodes. Since the distance between adjacent line contacts or small-area contacts is determined by the construction of the mesh screen, it is not necessary to adjust these distances manually.

What is claimed is:

1. A semi-conductor device comprising a body of semi-conducting material having a surface, a mesh screen consisting of two sets of filamentary conductors, each of said conductors being covered by an insulating layer except on one surface of said screen, means for pressing and holding the uncovered conductive screen surface in electrical contact with the surface of said body, and conductive means interconnecting selected conductors of each set, thereby to provide a plurality of small-area contacts between each of said conductors and said body.

2. A device as defined in claim 1 wherein alternate conductors of each set are interconnected.

3. A device as defined in claim 1 wherein all conductors of each set are interconnected.

4. A semi-conductor device comprising a body of semi-conducting material having a substantially flat surface, a mesh screen consisting of two sets of filamentary conductors arranged substantially at right angles to each other, each of said conductors being covered by an insulating layer except on one surface of said screen, means for pressing and holding the uncovered screen surface against the flat surface of said body, and leads interconnecting selected conductors of each set, thereby to provide a plurality of small-area contacts between each of said conductors and said body.

5. A semi-conductor device comprising a body of semi-conducting material having a surface, a mesh screen consisting of two sets of fine wires extending substantially at right angles to each other, each of said wires being partly covered by a layer of insulating material, means for pressing said uninsulated screen surface against the surface of said body, conductors interconnecting selected ones of the wires of each set, thereby to provide a plurality of line contacts between each wire and said body, and a further electrode in low-resistance contact with said body.

6. A device as defined in claim 5 wherein alternate ones of the wires of each set are interconnected.

7. A device as defined in claim 5 wherein all the wires of each set are interconnected.

8. A semi-conductor device comprising a body of semi-conducting material having a substantially flat surface, a mesh screen consisting of two sets of fine wires extending substantially at right angles to each other, each of said wires being covered by a layer of insulating material except on one surface of said screen, resilient means for pressing said uninsulated screen surface against said flat surface, conductors interconnecting selected ones of the wires of each set, thereby to provide a plurality of line contacts between each wire and said body, and a further electrode in low-resistance contact with another surface of said body.

JEROME KURSHAN.

REFERENCES CITED

The following references are of record in the file of this patent:

UNITED STATES PATENTS

| Number | Name | Date |
|---|---|---|
| 2,173,904 | Holst et al. | Sept. 26, 1939 |
| 2,208,455 | Glaser et al. | July 16, 1940 |